United States Patent
Heo et al.

(10) Patent No.: US 10,020,349 B2
(45) Date of Patent: Jul. 10, 2018

(54) ORGANIC LIGHT EMITTING DEVICE

(71) Applicant: LG Display Co., Ltd., Seoul (KR)

(72) Inventors: JeongHaeng Heo, Paju-si (KR); Jaeil Song, Paju-si (KR); SangGun Lee, Uijeongbu-si (KR); SoYeon Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 15/157,163

(22) Filed: May 17, 2016

(65) Prior Publication Data
US 2016/0343776 A1  Nov. 24, 2016

(30) Foreign Application Priority Data

May 23, 2015  (KR) .......................... 10-2015-0072267

(51) Int. Cl.
| | |
|---|---|
| H01L 27/32 | (2006.01) |
| H01L 51/00 | (2006.01) |
| H01L 51/50 | (2006.01) |
| H01L 51/52 | (2006.01) |

(52) U.S. Cl.
CPC ........ H01L 27/322 (2013.01); H01L 51/5004 (2013.01); H01L 51/5056 (2013.01); H01L 51/5072 (2013.01); H01L 51/5088 (2013.01); H01L 51/5271 (2013.01); H01L 51/5278 (2013.01); *H01L 51/005* (2013.01); *H01L 51/006* (2013.01); *H01L 51/0058* (2013.01); *H01L 51/0059* (2013.01); *H01L 51/0072* (2013.01); *H01L 2251/552* (2013.01)

(58) Field of Classification Search
CPC .............. H01L 27/322; H01L 51/5088; H01L 51/5056; H01L 51/5072; H01L 51/5271; H01L 51/5004; H01L 51/5278; H01L 2251/552; H01L 51/0072; H01L 51/005; H01L 51/006; H01L 51/0058; H01L 51/0059
See application file for complete search history.

(56) References Cited

U.S. PATENT DOCUMENTS

2013/0320308 A1* 12/2013 Lee .......................... H01L 51/52
257/40

OTHER PUBLICATIONS

Karzazi, Y., "Organic Light Emitting Diodes: Devices and applications", J. Mater. Environ. Sci 5 (1) (2014), pp. 1-12.*

* cited by examiner

*Primary Examiner* — Patrick Dennis Niland
(74) *Attorney, Agent, or Firm* — Fenwick & West LLP

(57) ABSTRACT

Provided is an organic light emitting device. The organic light emitting device includes a plurality of light emitting units laminated between a first electrode and a second electrode and each including an organic emitting layer, and a charge generation layer between the light emitting units. Further, the charge generation layer includes an N-type charge generation layer disposed to be in direct contact with an organic emitting layer of the adjacent light emitting unit and HOMO levels of the N-type charge generation layer and the organic emitting layer are regulated. Thus, a color change rate based on a viewing angle can be improved, and efficiency and a lifetime of the organic light emitting device can be improved.

18 Claims, 4 Drawing Sheets

ORGANIC LIGHT EMITTING DEVICE

CROSS-REFERENCE TO RELATED APPLICATIONS

This application claims the priority of Republic of Korea Patent Application No. 10-2015-0072267 filed on May 23, 2015, in the Korean Intellectual Property Office, the disclosure of which is incorporated herein by reference.

BACKGROUND

Field

The present disclosure relates to an organic light emitting device and more particularly, to an organic light emitting device having a multi-layer light emitting structure and capable of improving a color change rate based on viewing angle, efficiency, and a lifetime of the device.

Description of the Related Art

An organic light emitting display (OLED) device is a self-light emitting display device and does not need a separate light source as in a liquid crystal display device. Thus, the OLED device can be manufactured into a light-weight and thin form. Further, the OLED device is advantageous in terms of power consumption since it is driven with a low voltage. Also, the OLED device has excellent color expression ability, a high response speed, a wide viewing angle, and a high contrast ratio (CR). Therefore, the OLED device is being developed as a next-generation display device.

The OLED device includes an organic emitting layer that emits light by a reactive combination of electrons and holes. Generally, an organic light emitting device includes an anode, a hole injection layer (HIL), a hole transport layer (HTL), an organic emitting layer (EML), an electron transport layer (ETL), an electron injection layer (EIL), and a cathode.

Recently, an OLED device having a tandem structure (i.e. a stack of two or more layers or two or more multi-layer light emitting units) manufactured by laminating a plurality of organic emitting layers has been actively researched to improve luminous efficiency and a lifetime of an organic light emitting device. Specifically, each light emitting unit includes an organic EML and may further include an HIL, an HTL, an ETL, and an EIL.

If a plurality of light emitting units is laminated as in the OLED device having a tandem structure, it is difficult for holes and electrons generated from an anode and a cathode to be smoothly transferred to each of the plurality of organic light emitting layers. Thus, efficiency of the organic light emitting device may be reduced. Therefore, in order to improve the efficiency of the organic light emitting device, a charge generation layer capable of efficiently supplying electrons and holes to the organic emitting layers is disposed between the plurality of light emitting units.

Hereinafter, a conventional organic light emitting device having a tandem structure including two light emitting units will be described.

The conventional organic light emitting device having a tandem structure including two light emitting units has a structure in which an anode, a first light emitting unit, a charge generation layer, a second light emitting unit, and a cathode are laminated in sequence.

The first light emitting unit is disposed on the anode and configured to emit a light of a first color. Specifically, the first light emitting unit may include an HIL, a first HTL, a first organic EML that emits the light of the first color, and a first ETL.

The second light emitting unit is disposed on the charge generation layer and configured to emit a light of a second color different from the first color. Specifically, the second light emitting unit may include a second HTL, a second organic EML that emits the light of the second color, a second ETL, and an EIL.

The charge generation layer is disposed between the first light emitting unit and the second light emitting unit and configured to regulate a balance of electrons and holes to be supplied to the first light emitting unit and the second light emitting unit, respectively. Specifically, the charge generation layer may include an N-type charge generation layer that transfers electrons to the first light emitting unit and a P-type charge generation layer that transfers holes to the second light emitting unit.

The organic light emitting device having a tandem structure may emit a white light by mixing lights emitted from the first light emitting unit and the second light emitting unit.

However, in the conventional organic light emitting device having a tandem structure, the N-type charge generation layer and the P-type charge generation layer constituting the charge generation layer are formed by separate deposition processes. Further, the HTL and the ETL constituting each light emitting unit are also formed by separate deposition processes. Therefore, numerous manufacturing processes are required.

Accordingly, in the conventional organic light emitting device having a tandem structure, various layers are laminated as components and a gap between the organic EMLs is increased by the laminated layers. If the gap between the organic EMLs is increased, an electroluminescence (EL) spectrum in a front view is greatly different from an EL spectrum in a side view. Therefore, optical characteristics related to a color change rate based on a viewing angle may deteriorate.

Meanwhile, the ETL is disposed between the organic EML and the N-type charge generation layer and configured to supply electrons from the N-type charge generation layer to the organic EML. However, if the ETL does not have a high mobility in the organic light emitting device including the multi-layer light emitting unit, electrons cannot be smoothly transferred from the N-type charge generation layer to the organic EML at a low current density, i.e., from about 0.01 mA/cm$^2$ to about 1 mA/cm$^2$. Thus, a resistance of the organic light emitting device is increased due to the remaining holes, which are not combined with electrons, among all holes transferred from the HTL to the organic EML. Therefore, as the resistance of the organic light emitting device is increased, a driving voltage of the organic light emitting device needs to be increased and thus a lifetime of the organic light emitting device is accordingly decreased.

SUMMARY

The inventors of the present disclosure recognized that a color change rate based on viewing angle of an organic light emitting device including a plurality of light emitting units can be improved by reducing a gap between organic emitting layers. Therefore, the inventors of the present disclosure considered the technical issues of omitting some of organic layers disposed in each conventional light emitting unit. Particularly, the inventors recognized that when an electron transport layer disposed in each light emitting unit is removed, a color change rate based on a viewing angle can be improved and a structure and a manufacturing process of an organic light emitting device can be simplified. However, if the electron transport layer is simply removed, holes, which need to be combined with electrons in an organic emitting layer, are immediately transferred (i.e. transferred too early) from the organic emitting layer to an N-type charge generation layer. Thus, the organic emitting layer cannot readily emit light and excitons are undesirably generated from another layer such as a charge generation layer. Therefore, the overall device performance, such as device efficiency and a lifetime, of the organic light emitting device is considerably reduced. Accordingly, the inventors of the present disclosure invented a novel organic light emitting device including a plurality of light emitting units having a special structure. Accordingly, such organic light emitting device is capable of maintaining organic light emitting device performance even when an electron transport layer is removed to improve a color change rate based on a viewing angle and also capable of improving a lifetime of an organic light emitting device.

An aspect of the present disclosure is to provide an organic light emitting device including a plurality of light emitting units in which a gap between organic emitting layers is reduced by removing an electron transport layer so as to improve a color change rate based on a viewing angle.

Another aspect to be achieved by the present disclosure is to provide an organic light emitting device including a plurality of light emitting units capable of improving a lifetime of the organic light emitting device by suppressing an increase in resistance of the organic light emitting device. Such increase in resistance occurs when the organic light emitting device is driven at a low current density and electrons cannot be smoothly transferred from an N-type charge generation layer to an organic emitting layer.

The aspects of the present disclosure are not limited to the aforementioned, and other aspects, which are not mentioned above, will be apparent to a person having ordinary skill in the art from the following description.

According to an aspect of the present disclosure, there is provided an organic light emitting device. The organic light emitting device includes a first electrode and a second electrode disposed to face each other. The organic light emitting device further includes a plurality of light emitting units laminated between the first electrode and the second electrode and each including an organic emitting layer and a charge generation layer between the light emitting units. The charge generation layer includes an N-type charge generation layer disposed to be in direct contact with at least a first organic emitting layer of the light emitting units. Herein, a highest occupied molecular orbital (HOMO) level of the N-type charge generation layer is higher than a HOMO level of the first organic emitting layer in contact with the N-type charge generation layer. In the organic light emitting device according to an exemplary embodiment of the present disclosure, the N-type charge generation layer and the first organic emitting layer are disposed to be in direct contact with each other. Further, HOMO levels of the N-type charge generation layer and the organic emitting layer are appropriately regulated. Thus, it is possible to improve a color change rate based on a viewing angle and also possible to improve efficiency and a lifetime of the organic light emitting device.

According to another aspect of the present disclosure, there is provided an organic light emitting device. The organic light emitting device includes a first electrode and a second electrode disposed to face each other. The organic light emitting device further includes a first light emitting unit disposed on the first electrode and including a first organic emitting layer, a second light emitting unit including a second organic emitting layer, and a third light emitting unit including a third organic emitting layer. A first charge generation layer disposed between the first light emitting unit and the second light emitting unit includes a first N-type charge generation layer. A second charge generation layer disposed between the second light emitting unit and the third light emitting unit includes a second N-type charge generation layer. Herein, the first N-type charge generation layer is disposed to be in direct contact with the first organic emitting layer to smoothly transfer electrons from the first N-type charge generation layer to the first organic emitting layer, or the second N-type charge generation layer is disposed to be in direct contact with the second organic emitting layer to smoothly transfer electrons from the second N-type charge generation layer to the second organic emitting layer. In the organic light emitting device according to another exemplary embodiment of the present disclosure, at least one bonding surface between the N-type charge generation layer and the organic emitting layer is formed in the structure including the three light emitting units. Thus, it is possible to achieve an improved color change rate based on a viewing angle in a structure including a plurality of light emitting units.

Details of other exemplary embodiments will be included in the detailed description of the disclosure and the accompanying drawings.

According to the present disclosure, in an organic light emitting device including a plurality of light emitting units, an electron transport layer included in the light emitting unit is removed. Further, an organic emitting layer is in direct contact with an N-type charge generation layer. Therefore, it is possible to reduce a gap between organic emitting layers included in the respective light emitting units and thus possible to improve a color change rate based on a viewing angle.

Further, according to the present disclosure, it is possible to reduce the number of organic layers included in the plurality of light emitting units and thus possible to reduce the number of processes for manufacturing the organic light emitting device.

Furthermore, according to the present disclosure, the organic emitting layer and the N-type charge generation layer are in direct contact with each other while a HOMO level of the N-type charge generation layer in contact with the organic emitting layer is higher than a HOMO level of the organic emitting layer. Therefore, it is possible to smoothly transfer electrons from the N-type charge generation layer to the organic emitting layer and suppress a transfer of holes from the organic emitting layer to the N-type charge generation layer and thus possible to improve efficiency and a lifetime of the organic light emitting device.

The effects of the present disclosure are not limited to the aforementioned effects, and various other effects are included in the present specification.

BRIEF DESCRIPTION OF THE DRAWINGS

The above and other aspects, features, and other advantages of the present disclosure will be more clearly understood from the following detailed description taken in conjunction with the accompanying drawings.

DETAILED DESCRIPTION OF THE PREFERRED EMBODIMENTS

Figure 1:
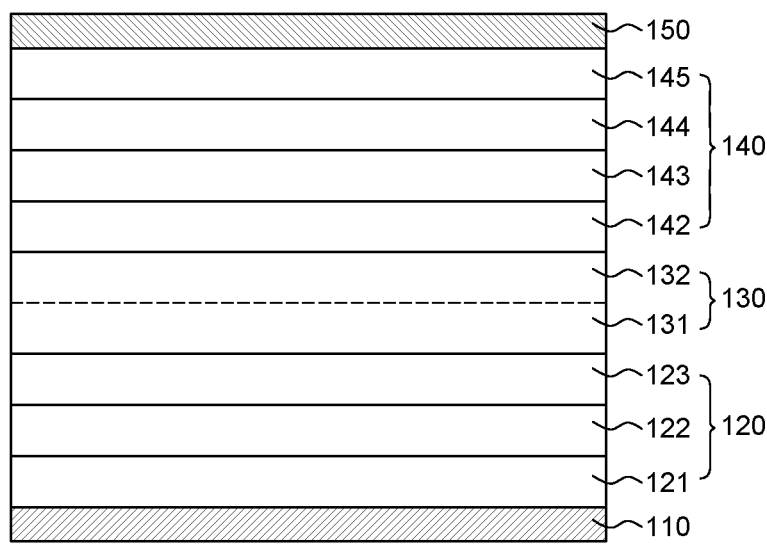
FIG. 1 is a schematic cross-sectional view provided to explain an organic light emitting device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

In the present specification, lowest unoccupied molecular orbital (LUMO) and highest occupied molecular orbital (HOMO) levels of a specific layer refer to LUMO and HOMO levels of a host material constituting the layer unless a dopant material is specified.

Hereinafter, various exemplary embodiments of the present disclosure will be described in detail with reference to the accompanying drawings.

FIG. 1 is a schematic cross-sectional view provided to explain an organic light emitting device according to an exemplary embodiment of the present disclosure. Referring to FIG. 1, an organic light emitting device 100 according to an exemplary embodiment of the present disclosure may include two light emitting units. The organic light emitting device 100 may include a first electrode 110, a first light emitting unit 120, a charge generation layer (CGL) 130, a second light emitting unit 140, and a second electrode 150.

The first electrode 110 is an anode that supplies holes to the first light emitting unit 120. The first electrode 110 may be formed of a transparent conductive material having a high work function. The first electrode 110 may be formed of a transparent conductive material such as tin oxide (TO), indium tin oxide (ITO), indium zinc oxide (IZO), and indium tin zinc oxide (ITZO), but is not limited thereto. In some exemplary embodiments, the organic light emitting device 100 may be applied to a top-emission OLED device. In this case, the organic light emitting device 100 may include a reflective layer formed of a highly reflective material such as silver (Ag) or an Ag alloy under the first electrode 110.

The second electrode 150 is a cathode that supplies electrons to the second light emitting unit 140. The second electrode 150 may be formed of a material having a low work function. The second electrode 150 may be formed of any one or more materials among opaque conductive materials such as magnesium (Mg), silver (Ag), aluminum (Al), and calcium (Ca) and alloys thereof, but is not limited thereto. In some exemplary embodiments, the organic light emitting device 100 may be applied to a top-emission OLED device. In this case, the second electrode 150 may have a semi-transmitting property to transmit light emitted from an organic emitting layer, and may be formed of an alloy of magnesium and silver (Mg:Ag).

The first light emitting unit 120 is laminated on the first electrode 110 and configured to emit a light of a first color. Specifically, the first light emitting unit 120 includes a hole injection layer (HIL) 121 disposed on the first electrode 110, a first hole transport layer (HTL) 122 disposed on the HIL 121, and a first organic emitting layer (EML) 123 disposed on the first HTL 122. In the organic light emitting device 100 according to an exemplary embodiment of the present disclosure, the first organic EML 123 is disposed to be in direct contact with a first N-type electron transport layer (ETL) 131. Thus, the first light emitting unit 120 does not include an electron transport layer.

The HIL 121 is an organic layer that enables holes to be smoothly injected from the first electrode 110 to the first organic EML 123. For example, the first HIL 121 may be formed of any one or more materials among dipyrazino[2,3-f:2',3'-h]quinoxaline-2,3,6,7,10.11-hexacarbonitrile (HATCN), phthalocyanine (CuPc), and N,N'-bis(naphthalene-1-yl)-N,N'-bis(phenyl)-2,2'-dimethylbenzidine (NPD), but is not limited thereto. The HIL 121 may be omitted according to a structure or characteristics of the device.

The first HTL 122 is an organic layer that transports holes from the HIL 121 to the first organic EML 123. The first HTL 122 enables the holes to be smoothly transported. The first HTL 122 may be formed of any one or more materials among N,N'-bis(naphthalene-1-yl)-N,N'-bis(phenyl)-2,2'-dimethylbenzidine (NPD), N,N'-bis-(3-methylphenyl)-N,N'-bis-(phenyl)-benzidine (TPD), 2,2',7,7'-tetrakis(N,N-dimethylamino)-9,9-spirofluorene (s-TAD), and 4,4',4"-Tris(N-3-methylphenyl-N-phenyl-amino)-triphenylamine (MTDATA), but is not limited thereto.

The first organic EML 123 is disposed on the first HTL 122. The first organic EML 123 may include a material capable of emitting light of a specific color. For example, the first organic EML 123 may include a light emitting material capable of emitting a red light, a green light, a blue light, or a yellow-green light, but is not limited thereto. The first organic EML 123 may include a light emitting material capable of emitting a light of another color.

More specifically, if the first organic EML 123 emits a red light, the first organic EML 123 may include a phosphorescent material including a host material including, e.g., 4,4'-bis)carbozol-9-yl) biphenyl (CBP) or 1,3-bis(carbazol-9-yl)benzene (mCP) and a dopant including any one or more materials among $Ir(piq)_3$(tris(1-phenylisoquinoline) iridium), $Ir(piq)_2$(acac)(bis(1-phenylisoquinoline)(acetylacetonate)(iridium), and octaethylporphine platinum (PtOEP). Otherwise, the first organic EML 123 may include a fluorescent material including PBD:Eu (DBM)3(Phen) or perylene, but is not limited thereto.

Further, if the first organic EML 123 emits a green light, the first organic EML 123 may include a phosphorescent material including a host material including, e.g., CBP or mCP and a dopant material such as a Ir complex including Ir(ppy)3(tris(2-phenylpyridine)iridium). Otherwise, the first organic EML 123 may include a fluorescent material including $Alq_3$(tris(8-hydroxyquinolino)aluminum), but is not limited thereto.

Furthermore, if the first organic EML 123 emits a blue light, the first organic EML 123 may include a phosphorescent material including a host material including, e.g., CBP or mCP and a dopant material including, FIrPic(bis(3,5-difluoro-2-(2-pyridyl)phenyl-(2-carboxyprdidyl)iridium). Otherwise, the first organic EML 123 may include a fluorescent material including any one or more materials among spiro-BDAVBi(2,7-bis[4-(diphenylamino)styryl]-9,9'-spirofluorene), distylbenzene (DSB), distyrylarylene (DSA), PFO-based polymers, and PPV-based polymers, but is not limited thereto.

The second light emitting unit 140 is disposed on the first light emitting unit 120 and configured to emit a light of a second color. Specifically, the second light emitting unit 140 includes a second HTL 142, a second organic EML 143, an ETL 144, and an electron injection layer (EIL) 145.

The second HTL 142 is an organic layer that transports holes from a P-type charge generation layer 132 to the second organic EML 143. The second HTL 142 may be formed of the same material as the first HTL 122. Details thereof are the same as described above for the first HTL 122. Therefore, detailed description thereof will be omitted.

The second organic EML 143 is disposed on the second HTL 142. The second organic EML 143 may include a material capable of emitting light of a specific color. For example, the second organic EML 143 may include a light emitting material capable of emitting a red light, a green light, a blue light, or a yellow-green light, but is not limited thereto. The second organic EML 143 may include a light emitting material capable of emitting a light of another color.

In some exemplary embodiments, if the organic light emitting device 100 is configured to emit a white light, the first organic EML 123 may be configured to emit a blue light and the second organic EML 143 may be configured to emit a yellow-green or green light.

The ETL 144 is disposed on the second organic EML 143. The ETL 144 is an organic layer that transports electrons from the EIL 145 to the second organic EML 143. A thickness of the ETL 144 may be regulated considering electron transport properties. The ETL 144 may be formed of any one or more materials among Liq(8-hydroxyquinolinato-lithium), 2-(4-biphenyl)-5-(4-tert-butylphenyl)-1,3,4oxadiazole (PBD), 3-(4-biphenyl) 4-phenyl-5-tert-butyl-phenyl-1,2,4-triazole (TAZ), spiro-PBD, and BAlq(bis(2-methyl-8-quinolinolate)-4-(phenylphenolato)aluminium), but is not limited thereto.

The EIL 145 is disposed on the ETL 144. The EIL 145 is an organic layer that enables electrons to be smoothly injected from the second electrode 150 to the second organic EML 143. The EIL 145 may be formed of any one or more materials among 2-(4-biphenyl)-5-(4-tert-butylphenyl)-1,3,4oxadiazole (PBD), 3-(4-biphenyl)4-phenyl-5-tert-butyl-phenyl-1,2,4-triazole (TAZ), spiro-PBD, and BAlq(bis(2-methyl-8-quinolinolate)-4-(phenylphenolato)aluminium), but is not limited thereto. Further, the EIL 145 may be omitted according to characteristics or a structure of the device.

The CGL 130 is disposed between the first light emitting unit 120 and the second light emitting unit 140. The CGL 130 is configured to regulate a balance of charges between the first organic EML 123 and the second organic EML 143. The CGL 130 includes an N-type charge generation layer (N-CGL) 131 and a P-type charge generation layer (P-CGL) 132.

The N-CGL 131 is configured to inject electrons to the first light emitting unit 120. Referring to FIG. 1, the N-CGL 131 is disposed to be in direct contact with the first organic EML 123 of the first light emitting unit 120 in order to improve a color change rate based on a viewing angle of the organic light emitting device 100.

A highest occupied molecular orbital (HOMO) level of the N-CGL 131 is higher than a HOMO level of the first organic EML 123 in contact with the N-CGL 131. If the HOMO level of the N-CGL 131 is higher than the HOMO level of the first organic EML 123, efficiency and a lifetime of the organic light emitting device 100 can be improved even when an electron transport layer between the first organic EML 123 and the N-CGL 131 is removed. Further, a gap between the first organic EML 123 and the second organic EML 143 can be reduced, and, thus, a color change rate based on a viewing angle can be improved.

More specifically, an organic light emitting device including two light emitting units according to the Comparative Example has a structure in which a first light emitting unit, a CGL, and a second light emitting unit are laminated or otherwise stacked in sequence. Herein, each light emitting unit generally has a structure in which a HTL, an organic EML, and an ETL are laminated or otherwise stacked in sequence. Therefore, an N-CGL is disposed to be in contact with the ETL of the first light emitting unit. In the organic light emitting device including two light emitting units according to the Comparative Example, there is a large gap between the organic EML of the first light emitting unit and the organic EML of the second light emitting unit. Therefore, optical characteristics related to a color change rate based on a viewing angle may deteriorate.

Specifically, a color shift occurs, since an intensity of an EL spectrum of an organic light emitting display (OLED) device varies depending on a viewing angle. The color shift refers to a phenomenon where color coordinates are changed according to a viewing angle. An electroluminescence (EL) spectrum is expressed by multiplying a photoluminescence (PL) spectrum of a light emitting material and an emittance spectrum which varies depending on a thickness and optical characteristics of an organic layer such as an ETL. When, a thickness of an organic layer disposed between an organic EML of a first light emitting unit and an organic EML of a second light emitting unit may be increased, a difference between a vertical distance between the organic EML of the first light emitting unit and the organic EML of the second light emitting unit, and a slant distance between the organic EML of the first light emitting unit and the organic EML of the second light emitting unit is also increased. Herein, the slant distance between the organic EML of the first light emitting unit and the organic EML of the second light emitting unit means a distance in a specific angle θ direction which is not perpendicular to the organic EML of the first light emitting unit and the organic EML of the second light emitting unit. Further, if the difference between the vertical distance between the organic EML of the first light emitting unit and the organic EML of the second light emitting unit, and the slant distance between the organic EML of the first light emitting unit and the organic EML of the second light emitting unit is increased, an EL spectrum in a front view is greatly different from an EL spectrum in a view at the specific angle θ according to the definition of the EL spectrum described above. Therefore, the vertical distance between the organic EML of the first light emitting unit and the organic EML of the second light emitting unit needs to be reduced such that the EL spectrum in a front view and the EL spectrum in a view at the specific angle θ are similar to each other as much as possible.

Accordingly, in order to reduce a color shift according to a viewing angle, removing the organic layer between the organic EML of the first light emitting unit and the organic EML of the second light emitting unit may be considered. An electron transport layer as one of the organic layers cannot readily transport electrons from a charge generation layer to an organic emitting layer at a low current density. Therefore, the organic emitting layer cannot emit light, which reduces a lifetime or efficiency of an organic light emitting device. Accordingly, in the present disclosure, a method of omitting an electron transport layer of the organic layers, which affects a lifetime or efficiency of an organic light emitting device, is considered.

In an organic light emitting device according to the Comparative Example, if an ETL included in a light emitting unit is simply removed, a gap between a plurality of organic EMLs included in a plurality of light emitting units is reduced. Therefore, a color change rate based on a viewing angle can be improved. However, a HOMO level of an N-CGL is equal to or lower than a HOMO level of an organic EML in contact with the N-CGL according to the Comparative Example, and thus, efficiency and a lifetime of the organic light emitting device are reduced.

Specifically, in the organic light emitting device including two light emitting units according to the Comparative Example, a HOMO level of the N-CGL is equal to or lower than a HOMO level of the first organic EML. If the first ETL is removed and the first organic EML is disposed to be in direct contact with the N-CGL, holes that need to generate excitons in the first organic EML can be readily transferred to the N-CGL because the HOMO level of the N-CGL is equal to or lower than the HOMO level of the first organic EML. Thus, holes and electrons are undesirably combined in other layers instead of in the first organic EML to generate excitons. If excitons are generated in other layers instead of in the first organic EML, it is difficult for the excitons to transfer energy to the first organic EML. Therefore, luminous efficiency is greatly reduced and a lifetime or efficiency of the organic light emitting device is reduced.

Therefore, in the organic light emitting device 100 according to an exemplary embodiment of the present disclosure, a HOMO level of the N-CGL 131 is set to be higher than a HOMO level of the first organic EML 123 in contact with the N-CGL 131. Thus, it is difficult for holes to be transferred from the first organic EML 123 to the N-CGL 131 due to a difference in HOMO level between the first organic EML 123 and the N-CGL 131. Further, excitons are generated in the first organic EML 123. Thus, performance and a lifetime of the device can be improved. The difference in HOMO levels between the N-CGL 131 and the first organic EML 123 in contact with the N-CGL 131 may be in the range of from 0.2 eV to 0.8 eV. If the difference in HOMO levels between the N-CGL 131 and the first organic EML 123 is in the above-described range, a lifetime and efficiency of the organic light emitting device can be increased. Further, in the organic light emitting device 100 according to an exemplary embodiment of the present disclosure, the HOMO level of the N-CGL 131 may be from −5.3 eV to −5.7 eV, such that, the difference in HOMO levels between the N-CGL 131 and the first organic EML 123 can be in the range of from 0.2 eV to 0.8 eV.

Furthermore, a lowest unoccupied molecular orbital (LUMO) level of the N-CGL 131 may be higher than a LUMO level of the first organic EML 123 in contact with the N-CGL 131. For example, the LUMO level of the N-CGL 131 may be in the range of from −2.6 to −3.0 eV. If the LUMO level of the N-CGL 131 is in the above-described range, electrons can be readily transferred from the N-CGL 131 to the first organic EML 123. Therefore, it is possible to solve the issue of a limited transfer of electrons at a low current density. Accordingly, the organic light emitting device 100 has the performance of an organic light emitting device without an electron transport layer and device efficiency at a low current density can be improved.

The N-CGL 131 may include an N-type dopant and an N-type host material.

More specifically, the N-type dopant improves electric conductivity of the N-CGL. The N-type dopant may include metals of Group I and Group II of the periodic table, organic materials to which electrons can be injected, or mixtures thereof. Specifically, the N-type dopant may be any one among alkali metals and alkali earth metals. Herein, examples of the alkali metals may include lithium (Li), cesium (Cs), sodium (Na), and potassium (K). Examples of the alkali earth metals may include strontium (Sr), barium (Ba), radium (Ra), and magnesium (Mg).

The N-type host material in the N-CGL 131 may be a phenanthroline derivative in order to satisfy the above-described HOMO level and LUMO level of the N-CGL 131.

More specifically, the host material in the N-CGL 131 may be a compound represented by the following Chemical Formula 1.

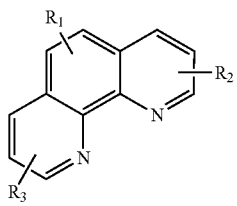

[Chemical Formula 1]

Herein, in Chemical Formula 1, $R_1$ to $R_3$ each independently represents a substituted or unsubstituted $C_1$ to $C_{10}$ alkyl group, a substituted or unsubstituted $C_1$ to $C_{18}$ aryl group, a hydrogen atom, or a halogen atom. For example, $R_1$ to $R_3$ may be derivatives of phenyl, naphthalenyl, phenanthrolinyl, or pyrenyl groups.

The P-CGL 132 is configured to inject holes to the second light emitting unit 140. The P-CGL 132 is disposed on the N-CGL 131 and bonded to (or otherwise attached or in contact with) the N-CGL 131. The P-CGL 132 may include a P-type dopant and a P-type host material. The P-type dopant may include metal oxide, organic materials such as tetrafluoro-tetracyanoquinodimethane (F4-TCNQ), dipyrazino[2,3-f:2',3'-h]quinoxaline-2,3,6,7,10.11-hexacarbonitrile (HAT-CN), and hexaazatriphenylene, or metal materials such as $V_2O_5$, MoOx, and $WO_3$. The P-type host material may include a material capable of transferring holes, and may include, for example, any one or more among N,N'-bis(naphthalene-1-yl)-N,N'-bis(phenyl)-2,2'-dimethylbenzidine (NPD), N,N'-bis-(3-methylphenyl)-N,N'-bis-(phenyl)-benzidine (TPD), and 4,4',4'''-Tris(N-3-methylphenyl-N-phenyl-amino)-triphenylamine (MTDATA), but is not limited thereto.

Hereinafter, some effects of the organic light emitting device 100 according to an exemplary embodiment of the present disclosure will be described in more detail with reference to FIG. 2 and FIG. 3. In order to explain the effects of the organic light emitting device 100 according to an exemplary embodiment of the present disclosure, organic light emitting devices each including two light emitting units with an ETL and a N-CGL different in position and configuration were manufactured according to Comparative Example 1, Comparative Example 2, Example 1, and Example 2.

Figure 2:
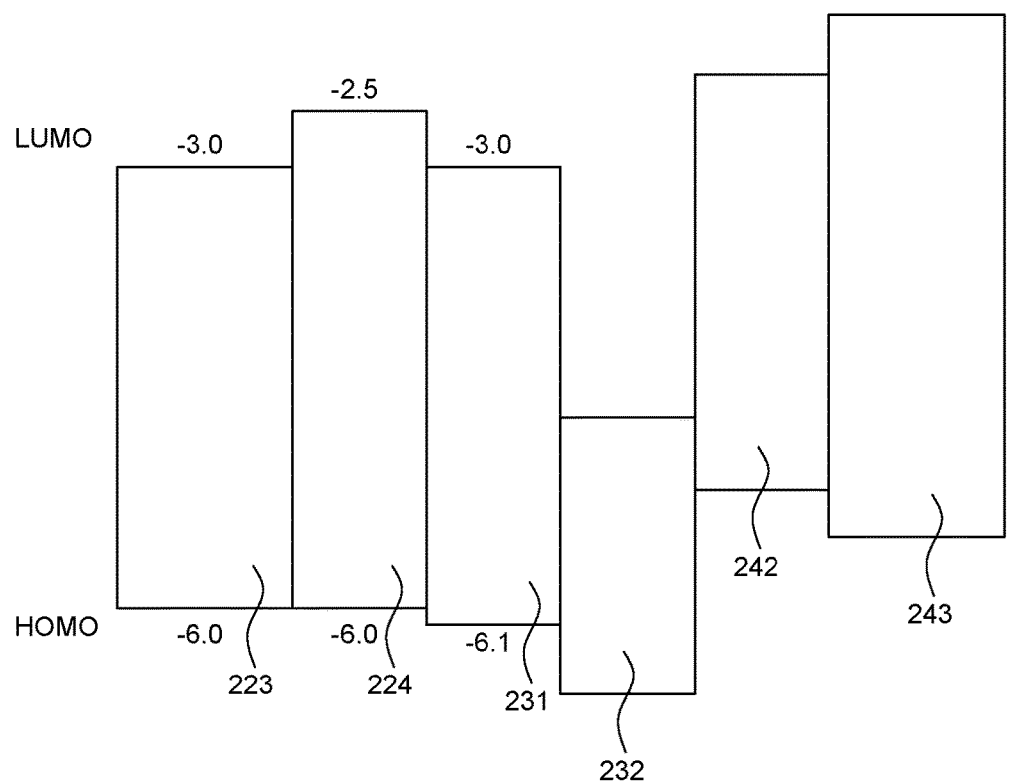
FIG. 2 shows an energy band diagram of an organic light emitting device according to a Comparative Example.
Figure 3:
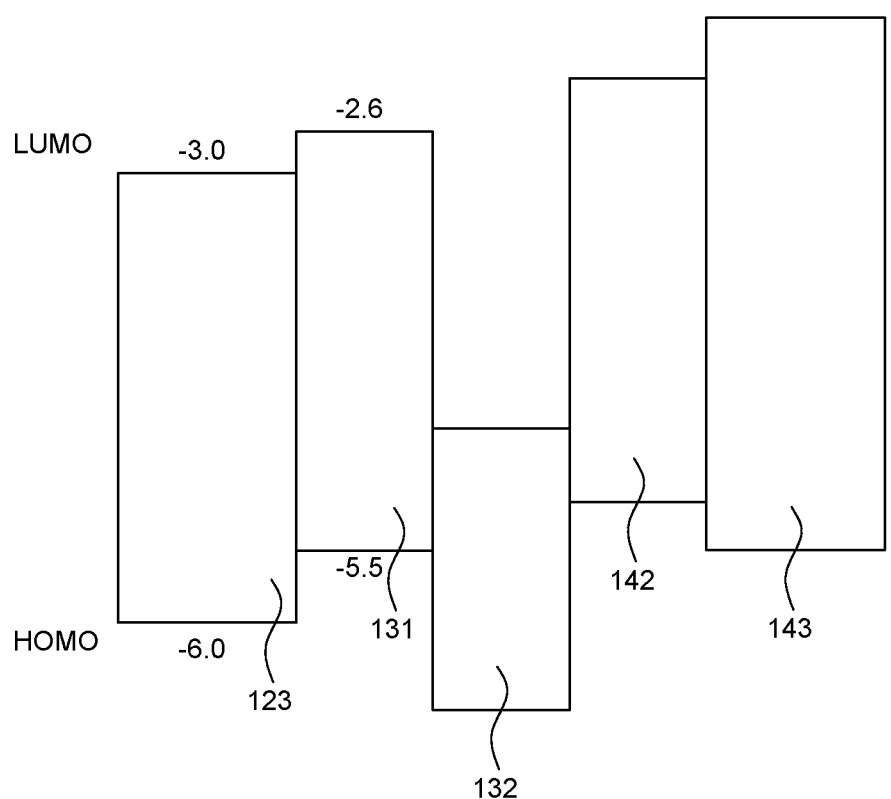
FIG. 3 shows an energy band diagram of an organic light emitting device according to an exemplary embodiment of the present disclosure.

FIG. 2 shows an energy band diagram of some layers constituting an organic light emitting device according to Comparative Example 1. FIG. 3 shows an energy band diagram of some layers constituting an organic light emitting device according to Example 1 and Example 2 of the present disclosure. FIG. 2 shows LUMO levels and HOMO levels of a first organic EML 223, a first ETL 224, a N-CGL 231, a P-CGL 232, a second HTL 242, and a second organic EML 243 of an organic light emitting device according to Comparative Example 1. FIG. 3 shows LUMO levels and HOMO levels of the first organic EML 123, the N-CGL 131, the P-CGL 132, the second HTL 142, and the second organic EML 143 of the organic light emitting device according to an exemplary embodiment of the present disclosure.

Comparative Example 1 is the organic light emitting device including two light emitting units and having a structure in which a first electrode, a first light emitting unit (HIL/HTL 1/EML 1/ETL 1), a CGL (N-CGL 1/P-CGL 1), a second light emitting unit (HTL 2/EML 2/ETL 2/EIL), and a second electrode are laminated in sequence. The respective layers of Comparative Example 1 have an energy band diagram shown in FIG. 2.

Comparative Example 2 is an organic light emitting device having the same structure as the organic light emitting device according to Comparative Example 1 except for the absence of the first ETL. Comparative Example 2 has the same structure and the same energy band diagram as Comparative Example 1 except that the first light emitting unit does not include the first ETL 224.

Example 1 is an organic light emitting device in which the two light emitting units according to an exemplary embodiment of the present disclosure are disposed. Example 1 has a structure as illustrated in FIG. 1. Specifically, Example 1 has a structure in which a first electrode, a first light emitting unit (HIL/HTL 1/EML 1), a CGL (N-CGL 1/P-CGL 1), a second light emitting unit (HTL 2/EML 2/ETL/EIL), and a second electrode are laminated in sequence. The respective layers of Example 1 have an energy band diagram shown in FIG. 3. Herein, a dopant included in the N-CGL of Example 1 is illustrated as being contained in an amount of 2% with respect to the total volume of the N-CGL. Herein, the HIL of the first light emitting unit or the EIL of the second light emitting unit may be omitted.

Example 2 has the same structure and the same energy band diagram as Example 1 except that a dopant included in the N-CGL is contained in an amount of 2.2% with respect to the total volume of the N-CGL of the organic light emitting device of Example 1.

Table 1 shows driving voltages (V), luminous efficiency (cd/A), T95 lifetimes, and variations in color change rate based on a viewing angle of the organic light emitting devices according to the above-described Comparative Examples 1 and 2 and Examples 1 and 2. The driving voltages were measured at a current density of 10 mA/cm$^2$. The T95 lifetime refers to the time required for an organic light emitting device to decrease to 95% of a lifetime. In Table 1, the T95 lifetimes are expressed as relative values where the T95 lifetime of Comparative Example 1 is assumed as a reference of 100%. Further, the color change rate based on a viewing angle was evaluated by calculating a variation (ΔU'V') between color coordinates measured at 0° (front side) and color coordinates measured at 60°. A small variation ΔU' V' means a small change in color when moving from a front side to a lateral side. Thus, a smaller variation ΔU' V' means an excellent color change rate based on a viewing angle.

TABLE 1

| Division | Voltage (V) | Luminous efficiency (cd/A) | T95 lifetime (%) | Color change rate based on a viewing angle (ΔU'V') |
|---|---|---|---|---|
| Comparative Example 1 | 10.8 | 84.0 | 100% | 0.018 |
| Comparative Example 2 | 9.8 | 78.4 | 90% | 0.014 |
| Example 1 | 10.9 | 83.4 | 101% | 0.014 |
| Example 2 | 10.8 | 83.9 | 105% | 0.014 |

In comparison between Comparative Example 1 and Examples 1 and 2, it was observed that a color change rate based on a viewing angle was improved in Examples 1 and 2 where an ETL was omitted as compared with Comparative Example 1. Therefore, it was observed that when an ETL was removed and a first organic EML was disposed in direct contact with an N-CGL, a gap between the first organic EML and a second organic EML was reduced and a color change rate based on a viewing angle was improved.

In comparison between Comparative Example 2 and Examples 1 and 2, it was observed that luminous efficiency and a lifetime of an organic light emitting device were improved in Examples 1 and 2 as compared with Comparative Example 2. Referring to FIG. 2 and FIG. 3, a HOMO level of the N-CGL of Example 1 was −5.5 which is higher than −6.1 as a HOMO level of the N-CGL of Comparative Example 1. Therefore, a transfer of holes present in the first organic EML to the N-CGL is suppressed. Further, a LUMO level of the N-CGL of Example 1 was −2.6 which is higher than −3.0 as a LUMO level of the N-CGL of Comparative Example 1. Therefore, electrons can be readily transferred from the N-CGL to the first organic EML. As a result, holes and electrons can be combined and the first organic EML can normally emit light. Therefore, it is possible to suppress an increase in resistance and a decrease in lifetime of the organic light emitting device.

According to the above-described results, in the organic light emitting device of an exemplary embodiment of the present disclosure, the ETL is omitted and the first organic EML is disposed to be in direct contact with the N-CGL. Further, a HOMO level of the N-CGL is regulated to be higher than a HOMO level of the first organic EML in contact with the N-CGL. Therefore, a color change rate based on a viewing angle can be improved, and efficiency and a lifetime of the organic light emitting device can be improved.

Figure 4:
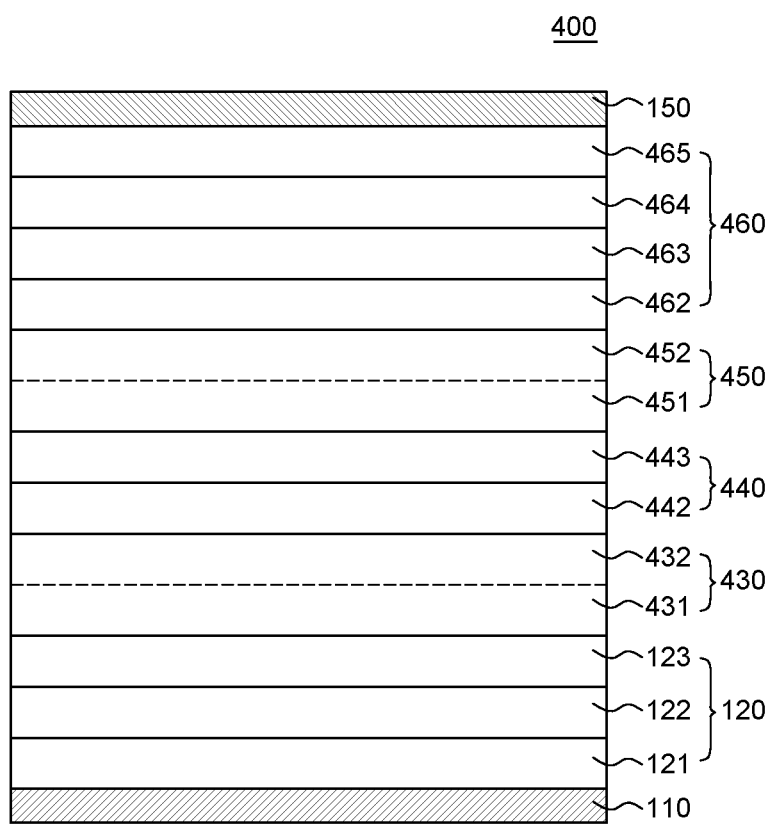
FIG. 4 is a schematic cross-sectional view provided to explain an organic light emitting device according to another exemplary embodiment of the present disclosure.

FIG. 4 is a schematic cross-sectional view provided to explain an organic light emitting device according to another exemplary embodiment of the present disclosure. Referring to FIG. 4, an organic light emitting device 400 includes the first electrode 110, the first light emitting unit 120, a first CGL 430, a second light emitting unit 440, a second CGL 450, a third light emitting unit 460, and the second electrode 150. The organic light emitting device 400 illustrated in FIG. 4 is the same as the organic light emitting device 100 illustrated in FIG. 1 except that the second CGL 450 and the third light emitting unit 460 are added, the second light emitting unit 440 has a different structure, and organic EMLs 123, 443, and 463 have different configurations. Therefore, the redundant description thereof will be omitted. Hereinafter, the organic light emitting device 400 will be described as being configured to emit a white light by combination of the three light emitting units.

The first organic EML 123 is configured to emit light of a first color. As described above, if the organic light emitting device 400 is configured to emit white light, the first organic EML 123 may emit, for example, a blue light. In the present specification, a blue light may be defined as a light having a peak wavelength in the range of from 440 nm to 480 nm. Further, the first organic EML 123 may be any one among a blue EML, a sky blue EML, and a deep blue EML.

The second light emitting unit 440 is disposed on the first CGL 430. The second light emitting unit 440 includes a second HTL 442 and a second organic EML 443. The second HTL 442 is the same as the second HTL 142 of the organic light emitting device 100 illustrated in FIG. 1. Therefore, redundant description thereof will be omitted.

The second organic EML 443 is configured to emit light of a second color. As described above, if the organic light emitting device 400 is configured to emit white light, the second organic EML 443 may emit, for example, yellow-green or green light. In the present specification, yellow-green or green light may be defined as a light having a peak wavelength in the range of 510 nm to 590 nm.

Since the second CGL 450 is disposed on the second light emitting unit 440, the second light emitting unit 440 does not include an ETL or an EIL. Otherwise, if an EIL is not included in the second light emitting unit 440, since the second CGL 450 is disposed on the second light emitting unit 440, the second light emitting unit 440 does not include an ETL.

The second CGL 450 is disposed on the second light emitting unit 440. The second CGL 450 includes a second N-CGL 451 and a second P-CGL 452. The second N-CGL 451 is configured to inject electrons into the second organic EML 443 and the second P-CGL 452 is configured to inject holes into a third organic EML 463. The second CGL 450, the second N-CGL 451, and the second P-CGL 452 can be the same as the N-CGL 131 and the P-CGL 132 illustrated in FIG. 1. Therefore, redundant description thereof will be omitted.

The third light emitting unit 460 is disposed on the second CGL 450. The third light emitting unit 460 includes a third HTL 462, a third organic EML 463, an ETL 464, and an EIL 465. The third HTL 462, the ETL 464, and the EIL 465 can be the same as the second HTL 142, the ETL 144, and the EIL 145 illustrated in FIG. 1. Therefore, the redundant description thereof will be omitted. Otherwise, the EIL 465 may be omitted.

The third organic EML 463 is configured to emit light of a third color. For example, the third organic EML 463 is configured to emit a red light or a blue light so as to be applied to the organic light emitting device configured to emit a white light. The red light may have a peak wavelength in the range of from 600 nm to 650 nm. Otherwise, the third organic EML 463 may be any one among a blue EML, a sky blue EML, and a deep blue EML. The third organic EML may emit a light having a peak wavelength in the range of from 440 nm to 480 nm.

In the organic light emitting device 400 illustrated in FIG. 4, the first CGL 430 is disposed between the first light emitting unit 120 and the second light emitting unit 440. The second CGL 450 is disposed between the second light emitting unit 440 and the third light emitting unit 460. The first CGL 430 includes the first N-CGL 431 and the first P-CGL 432, and the first N-CGL 431 is disposed in direct contact with the first organic EML 123. Likewise, the second CGL 450 includes the second N-CGL 451 and the second P-CGL 452, and the second N-CGL 451 is disposed in direct contact with the second organic EML 443.

Further, in the organic light emitting device 400 illustrated in FIG. 4, a HOMO level of the first N-CGL 431 is higher than a HOMO level of the first organic EML 123 in contact with the first N-CGL 431. More specifically, a difference between the HOMO level of the first N-CGL 431 and the HOMO level of the first organic EML 123 in contact with the first N-CGL 431 may be in the range of from 0.2 eV to 0.8 eV. Further, a HOMO level of the second N-CGL 451 is higher than a HOMO level of the second organic EML 443 in contact with the second N-CGL 451. More specifically, a difference between the HOMO level of the second N-CGL 451 and the HOMO level of the second organic EML 443 in contact with the second N-CGL 451 may be in the range from 0.2 eV to 0.8 eV.

In the organic light emitting device 400 according to another exemplary embodiment of the present disclosure, the first organic EML 123 is disposed to be in direct contact with the first N-CGL 431. Thus, a gap between the first organic EML 123 and the second organic EML 443 is reduced. Further, the second organic EML 443 is disposed to be in direct contact with the second N-CGL 451. Thus, a gap between the first organic EML 443 and the second organic EML 463 is reduced. Therefore, a color change rate based on a viewing angle of the organic light emitting device can be improved. Further, if a HOMO level between an organic EML and a N-CGL in contact with each other satisfies the above-described condition, holes and electrons can be readily combined in each organic EML. Therefore, efficiency and a lifetime of the second organic EML 443 can be improved.

FIG. 4 illustrates that the first organic EML 123 and the first N-CGL 431 are disposed to be in direct contact with each other and the second organic EML 443 and the second N-CGL 451 are disposed to be in direct contact with each other. However, in some exemplary embodiments, only the first organic EML 123 and the first N-CGL 431 may be disposed to be in direct contact with each other, or only the second organic EML 443 and the second N-CGL 451 may be disposed to be in direct contact with each other. That is, only one among the first N-CGL 431 and the second N-CGL 451 may be disposed in direct contact with the organic EML of the adjacent light emitting unit.

The exemplary embodiments of the present disclosure can also be described as follows:

According to an aspect of the present disclosure, an organic light emitting device includes a first electrode and a second electrode disposed to face each other. The organic light emitting device further includes a plurality of light emitting units laminated between the first electrode and the second electrode and each including an organic emitting layer and a charge generation layer between the light emitting units. The charge generation layer includes an N-type charge generation layer disposed to be in direct contact with the organic emitting layer of the light emitting unit. Herein, a highest occupied molecular orbitals (HOMO) level of the N-type charge generation layer is higher than a HOMO level of the organic emitting layer in contact with the N-type charge generation layer. In the organic light emitting device according to an exemplary embodiment of the present disclosure, the N-type charge generation layer and the organic emitting layer are disposed to be in direct contact with each other. Further, HOMO levels of the N-type charge generation layer and the organic emitting layer are appropriately regulated. Thus, it is possible to improve a color change rate based on a viewing angle and also possible to improve efficiency and a lifetime of the organic light emitting device.

The N-type charge generation layer may directly transfer electrons to the organic emitting layer in contact with the N-type charge generation layer.

The plurality of light emitting units may include at least a first light emitting unit and a second light emitting unit. The first electrode, the first light emitting unit, the charge generation layer, the second light emitting unit, and the second electrode may be disposed. The N-type charge generation layer may be in direct contact with the organic emitting layer of the first light emitting unit.

If the N-type charge generation layer is disposed to be in direct contact with the organic emitting layer, a lifetime or a color change rate based on a viewing angle of the organic light emitting device may be relatively improved as compared with a case where the N-type charge generation layer is not disposed to be in direct contact with the organic emitting layer.

A difference between the HOMO level of the N-type charge generation layer and the HOMO level of the organic emitting layer in contact with the N-type charge generation layer may be in the range of 0.2 eV to 0.8 eV.

The HOMO level of the N-type charge generation layer may be in the range of from −5.3 eV to −5.7 eV.

A lowest unoccupied molecular orbital (LUMO) level of the N-type charge generation layer may be higher than a LUMO level of the organic emitting layer in contact with the N-type charge generation layer.

The LUMO level of the N-type charge generation layer may be in the range of −2.6 eV to −3.0 eV.

The N-type charge generation layer may include a host and a dopant, and the host may be represented by the following Chemical Formula 1.

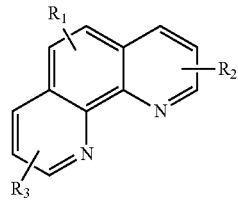

[Chemical Formula 1]

Herein, in Chemical Formula 1, $R_1$ to $R_3$ each independently represents one among a substituted or unsubstituted $C_1$ to $C_{10}$ alkyl group, a substituted or unsubstituted $C_1$ to $C_{18}$ aryl group, a hydrogen atom, and a halogen atom.

The N-type charge generation layer may include a host and a dopant, and the dopant may be contained in an amount of 2% to 10% with respect to the total volume of the N-type charge generation layer.

The charge generation layer may have a N-type charge generation layer bonded to a P-type charge generation layer.

The organic emitting layer in contact with the N-type charge generation layer may emit a blue light.

According to another aspect of the present disclosure, an organic light emitting device includes a first electrode and a second electrode disposed to face each other. The organic light emitting device further includes a first light emitting unit disposed on the first electrode and including a first organic emitting layer, a second light emitting unit including a second organic emitting layer, and a third light emitting unit including a third organic emitting layer, a first charge generation layer disposed between the first light emitting unit and the second light emitting unit and including a first N-type charge generation layer; and a second charge generation layer disposed between the second light emitting unit and the third light emitting unit and including a second N-type charge generation layer. Herein, the first N-type charge generation layer is disposed to be in direct contact with the first organic emitting layer to smoothly transfer electrons from the first N-type charge generation layer to the first organic emitting layer, or the second N-type charge generation layer is disposed to be in direct contact with the second organic emitting layer to smoothly transfer electrons from the second N-type charge generation layer to the second organic emitting layer. In the organic light emitting device according to another exemplary embodiment of the present disclosure, at least one bonding surface between the N-type charge generation layer and the organic emitting layer is formed in the structure including the three light emitting units. Thus, it is possible to achieve an improved color change rate based on a viewing angle in a structure including a plurality of light emitting units.

At least one among a difference between a HOMO level of the first charge generation layer and a HOMO level of the first organic emitting layer and a difference between a HOMO level of the second charge generation layer and a HOMO level of the second organic emitting layer may be in the range of 0.2 eV to 0.8 eV.

If the first N-type charge generation layer is disposed to be in direct contact with the first organic emitting layer, the first N-type charge generation layer may be configured to suppress a flow of holes from the first organic emitting layer to the first N-type charge generation layer. If the second N-type charge generation layer is disposed to be in direct contact with the second organic emitting layer, the second N-type charge generation layer may be configured to suppress a flow of holes from the second organic emitting layer to the second N-type charge generation layer.

If the first N-type charge generation layer is disposed to be in direct contact with the first organic emitting layer, a lifetime or a color change rate based on a viewing angle of the organic light emitting device may be relatively improved as compared with a case where the first N-type charge generation layer is not disposed to be in direct contact with the first organic emitting layer.

If the second N-type charge generation layer is disposed to be in direct contact with the second organic emitting layer, a lifetime or a color change rate based on a viewing angle of the organic light emitting device may be relatively improved as compared with a case where the second N-type charge generation layer is not disposed to be in direct contact with the second organic emitting layer.

The first organic emitting layer and the third organic emitting layer may emit blue lights, and the second organic emitting layer may emit a yellow-green or green light.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting device comprising:
a first electrode and a second electrode disposed to face each other;
a plurality of light emitting units between the first electrode and the second electrode and each including an organic emitting layer; and
a charge generation layer between the light emitting units, wherein the charge generation layer includes a N-type charge generation layer disposed to be in direct contact with an organic emitting layer of the light emitting units,
wherein a highest occupied molecular orbital (HOMO) level of the N-type charge generation layer is higher than a HOMO level of the organic emitting layer in direct contact with the N-type charge generation layer.

2. The organic light emitting device according to claim 1, wherein the N-type charge generation layer directly transfers electrons to the organic emitting layer in direct contact with the N-type charge generation layer.

3. The organic light emitting device according to claim 1, wherein the plurality of light emitting units includes at least a first light emitting unit and a second light emitting unit,
wherein the first electrode, the first light emitting unit, the charge generation layer, the second light emitting unit, and the second electrode are configured to be stacked in sequence, and
wherein the N-type charge generation layer is in direct contact with the organic emitting layer of the first light emitting unit.

4. The organic light emitting device according to claim 1, wherein the N-type charge generation layer being in direct contact with the organic emitting layer results in a lifetime or a color change rate based on a viewing angle of the organic light emitting device to be relatively improved as compared with a case where the N-type charge generation layer is not in direct contact with the organic emitting layer.

5. The organic light emitting device according to claim 1, wherein a difference between the HOMO level of the N-type charge generation layer and the HOMO level of the organic emitting layer in direct contact with the N-type charge generation layer is in a range of 0.2 eV to 0.8 eV.

6. The organic light emitting device according to claim 1, wherein the HOMO level of the N-type charge generation layer is in a range of −5.3 eV to −5.7 eV.

7. The organic light emitting device according to claim 1, wherein a lowest unoccupied molecular orbital (LUMO) level of the N-type charge generation layer is higher than a LUMO level of the organic emitting layer in direct contact with the N-type charge generation layer.

8. The organic light emitting device according to claim 1, wherein a LUMO level of the N-type charge generation layer is in a range of −2.6 eV to −3.0 eV.

9. The organic light emitting device according to claim 1, wherein the N-type charge generation layer includes a host and a dopant, and
the host is represented by the following Chemical Formula 1:

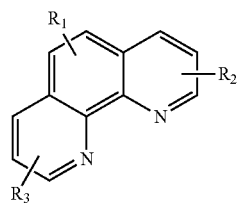

[Chemical Formula 1]

wherein in Chemical Formula 1, $R_1$ to $R_3$ each independently represents one among a $C_1$ to $C_{10}$ alkyl group, a $C_1$ to $C_{18}$ aryl group, a hydrogen atom, and a halogen atom.

10. The organic light emitting device according to claim 1, wherein the N-type charge generation layer includes a host and a dopant, and
the dopant is included in an amount of 2% to 10% with respect to a total volume of the N-type charge generation layer.

11. The organic light emitting device according to claim 1, wherein the charge generation layer further includes a P-type charge generation layer and the charge generation layer has a PN-junction structure.

12. The organic light emitting device according to claim 1, wherein the organic emitting layer in direct contact with the N-type charge generation layer emits a blue light.

13. An organic light emitting device comprising:
a first electrode and a second electrode disposed to face each other;
a first light emitting unit having a first organic emitting layer, a second light emitting unit having a second organic emitting layer, and a third light emitting unit having a third organic emitting layer on the first electrode;
a first charge generation layer between the first light emitting unit and the second light emitting unit and including a first N-type charge generation layer; and
a second charge generation layer between the second light emitting unit and the third light emitting unit and including a second N-type charge generation layer,
wherein the first N-type charge generation layer is in direct contact with the first organic emitting layer to smoothly transfer electrons from the first N-type charge generation layer to the first organic emitting layer, or the second N-type charge generation layer is in direct contact with the second organic emitting layer to smoothly transfer electrons from the second N-type charge generation layer to the second organic emitting layer,
wherein a highest occupied molecular orbital (HOMO) level of the first N-type charge generation layer is higher than a HOMO level of the first organic emitting layer in direct contact with the first N-type charge generation layer, and
wherein a HOMO level of the second N-type charge generation layer is higher than a HOMO level of the second organic emitting layer in direct contact with the second N-type charge generation layer.

14. The organic light emitting device according to claim 13, wherein at least one among a difference between a HOMO level of the first charge generation layer and the HOMO level of the first organic emitting layer and a difference between a HOMO level of the second charge generation layer and the HOMO level of the second organic emitting layer is in a range of 0.2 eV to 0.8 eV.

15. The organic light emitting device according to claim 13,
wherein the first N-type charge generation layer being in direct contact with the first organic emitting layer allows the first N-type charge generation layer to suppress a flow of holes from the first organic emitting layer to the first N-type charge generation layer, and
the second N-type charge generation layer being in direct contact with the second organic emitting layer allows the second N-type charge generation layer to suppress a flow of holes from the second organic emitting layer to the second N-type charge generation layer.

16. The organic light emitting device according to claim 13, wherein the first N-type charge generation layer being in direct contact with the first organic emitting layer results in a lifetime or a color change rate based on a viewing angle of the organic light emitting device to be relatively improved as compared with a case where the first N-type charge generation layer is not in direct contact with the first organic emitting layer.

17. The organic light emitting device according to claim 13, wherein the second N-type charge generation layer being in direct contact with the second organic emitting layer results in a lifetime or a color change rate based on a viewing angle of the organic light emitting device to be relatively improved as compared with a case where the second N-type charge generation layer is not in direct contact with the second organic emitting layer.

18. The organic light emitting device according to claim 13, wherein the first organic emitting layer and the third organic emitting layer emit blue light, and the second organic emitting layer emits one among a yellow-green light and a green light.

* * * * *